United States Patent [19]
Vogel et al.

[11] Patent Number: 4,993,395
[45] Date of Patent: Feb. 19, 1991

[54] HIGH-VOLTAGE OPTO-ELECTRONIC SWITCHING CIRCUIT

[75] Inventors: Manfred Vogel, Ditzingen Heimerdingen; Werner Herden, Gerlingen, both of Fed. Rep. of Germany

[73] Assignee: Robert Bosch GmbH, Stuttgart, Fed. Rep. of Germany

[21] Appl. No.: 557,207

[22] Filed: Jul. 24, 1990

[30] Foreign Application Priority Data

Oct. 24, 1989 [DE] Fed. Rep. of Germany ....... 3935379

[51] Int. Cl.⁵ .......................... F02P 7/03; F02P 7/73; H03K 17/78; H03K 17/10
[52] U.S. Cl. .................................. 123/643; 123/654; 123/655; 123/656; 307/311
[58] Field of Search ................ 123/146.5 A, 613, 643, 123/655, 654, 656; 307/311

[56] References Cited

U.S. PATENT DOCUMENTS

| 3,428,033 | 2/1969 | Watts | 123/146.5 A |
| 3,438,362 | 4/1969 | Clyborne et al. | 123/146.5 A |
| 3,459,943 | 8/1969 | Harnden, Jr. | 307/311 |
| 3,463,134 | 8/1969 | Zechnall et al. | 123/146.5 A |
| 3,524,986 | 8/1970 | Harnden, Jr. | 307/311 |
| 4,570,079 | 2/1986 | Davis | 307/311 |

FOREIGN PATENT DOCUMENTS 3731412 5/1988 Fed. Rep. of Germany ...... 123/643

Primary Examiner—Tony M. Argenbright
Attorney, Agent, or Firm—Frishauf, Holtz, Goodman & Woodward

[57] ABSTRACT

To reduce the size of a high-voltage semiconductor optically responsive switch, for example suitable to control the flow of ignition energy from an ignition coil (4) to a spark plug (ZK), a stack of disk or plate-shaped semiconductor chips (9) is formed with the major surfaces of the chips placed against each other and light responsive regions of the chips at the outer surface thereof to form an array of chips with a control surface (14). The light responsive regions (13) are large enough so that, at any position of the respective chips in the array, the can receive sufficient switching energy from a point source, such as a light emitting diode (17) (LED). Thus, a single LED can control all the semiconductor switching elements. Energy for operation of the LED can be obtained, directly, by connecting the LED across a capacitor (C) in series between the ignition coil (4) and the high-voltage semiconductor switch (2), with an additional opto-electronic switch (20, TH), controlled by a control circuit (16) therewith which, when rendered conductive by the control circuit, will cause the LED (17) to fire.

12 Claims, 2 Drawing Sheets

4,993,395

HIGH-VOLTAGE OPTO-ELECTRONIC SWITCHING CIRCUIT

FIELD OF THE INVENTION

The present invention relates to a high-voltage switching circuit with a high-voltage switch for controlling energy flow through the circuit, and more particularly to a high-voltage switch suitable to distribute ignition energy to spark plugs of an internal combustion engine.

BACKGROUND

It has previously been proposed to construct a high-voltage switch in form of an array formed by a plurality of semiconductor elements which are light-responsive. Such arrays can be used in automotive electronic technology, and especially to control the transfer of ignition energy, which is at high voltage levels, between an ignition coil and a spark plug. The opto-electronic elements are exposed to light to render conductive the normally OPEN or non-conductive electronic elements in dependence on computed ignition instants as determined by operating parameters of an internal combustion engine at the then existing operating states. Light emitting diodes (LEDs) can be used to apply light to the opto-electronic semiconductor switching elements.

Semiconductor switching elements, and also opto-electronic switches can be made in hybrid technology, and connected in cascade. A substrate has a plurality of semi-conductor elements located adjacent each other, in a row, and a corresponding number of LEDs is located with little spacing from the light emitting switching elements. A light transmissive insulating element is positioned between the LEDs and the respective semiconductor elements. Conductive tracks interconnect the semiconductor elements and, eventually, are connected to the high-voltage terminals for the switch. The LEDs are coupled to common control terminals. The overall construction is placed into a housing made of plastic, and encapsulated by a suitable encapsulating compound.

The cascade circuit, as described, is comparatively large and complex and requires a multiplicity of elements.

THE INVENTION

It is an object to provide an improved high-voltage switch, particularly a high-voltage switch suitable for use in automotive electronic applications, which is compact and essentially immune to external influences, and does not require a multiplicity of light emitting elements to control the semiconductor switching elements.

Briefly, a stack of disk or plate-like semiconductor chips, assembled into a semiconductor chip array, is assembled so that the chips are located with their major surfaces against each other, for serial connection. The chips each have a light or optically responsive control region which is located at an outer surface of the respective chips. The control regions of the array are exposed to a light source, for example an LED. Only a single LED is needed to control a multiplicity of semiconductor elements which, together, form the array.

The switch has the advantage that the cascade circuit formed thereby can accomodate a large number of serially connected opto-electronic semiconductor elements while requiring only little space and, further, not requiring a large number of LEDs for control of the semiconductor chips, but only one, for example. In accordance with a preferred feature of the invention, LEDs are used as the light emitting elements, and for most structures a single LED is sufficient to control the conductive state of the semiconductor elements in the array. This is made possible by placing the light sensitive control regions of the semiconductors formed by the chips in the stack at the outer surface thereof. Thus, the semiconductor chips—in contrast to the prior art—are not located next to each other on a flat surface of a substrate but, rather, form a stack of chips, in which the major surfaces of adjacent chips engage against each other. An array of, for example, 40 semiconductor chips can be combined into a stack of only 1 cm height. The blocking voltage of such chips is between about 600 and 800 V; a high-voltage switch of the 1 cm height dimension thus can switch 30 kV without difficulty. This is a voltage region which is entirely sufficient to operate spark plugs of an internal combustion engine (ICE). The light sensitive control regions of the semiconductor chips, at the outer circumferences or surfaces thereof, also permit elimination of individual control of the chips by individual light sources. The light intensity and the light distribution or light cone emitted by a single LED is sufficient to control the conduction state of all the semiconductor elements of the stack of chips in the array to change their state to ON or conduction.

The invention, thus, is based on the combination of two basic features, namely to stack the disk or plate-like chips with their major surfaces one above or against the other and to locate the light sensitive control regions at the outside of the stack of the chips.

In accordance with a preferred feature of the invention, the control regions at the surfaces of the respective chips are so constructed that they are of sufficient size to respond to light from an essentially point-shaped light source, such as an LED. This permits use of a single light source, for example a single LED, in order to control all the chips of the array.

Other light sources than an LED may be used and any light emitting structure will control the conduction state of the chips. Further, it is not necessary that the light emitting element directly acts on the semiconductor chips. In accordance with a feature of the invention, a light guide, for example optical fibers or an optical fiber cable connection, may be made between the light source and the chip array itself. Light for the light guide can, again, be an LED which provides light to the optical cable terminating in light transmitting relationship to the control surface formed by the array of semiconductor elements. Use of fiber optics to transmit light pulses to the semiconductor switching elements provides for particularly good galvanic separation and decoupling of the light emitting elements and the switching elements.

In accordance with a preferred feature of the invention, the LED itself is controlled by an optical switch which, in turn, is controlled from a control unit associated with the ICE. The control unit thus does not have to directly control the high-voltage cascaded array but, rather, only has to have sufficient output power to operate an optical switch which, in turn, controls the LED which is optically coupled to the semiconductor switching elements. Thus, two optical control paths are formed between the control unit and the switch as such.

In accordance with another feature of the invention, a portion of the energy within the ignition circuit of the ICE is used to operate the LED. For example, the ignition coil of the ignition circuit of the ICE has its secondary output connected via a capacitor to the cascade circuit which, in turn, is connected to a spark plug. A series circuit formed by the LED and the opto switch is connected in parallel to the capacitor. The charge voltage of the capacitor is used to operate the LED. This has the advantage that the control energy required for the opto switch can be substantially less than that required for the LED itself.

Preferably, photo thyristors are used for the semiconductor control elements, that is, the semiconductor chips; likewise, a photo thyristor is preferred for use as the opto switch, if this particular feature is selected.

DRAWINGS

FIG. 1 is a general circuit diagram of a high-voltage switch illustrating the overall principle of operation; and FIG. 2 is a detailed circuit diagram illustrating preferred features of the invention.

DETAILED DESCRIPTION

Figure 1:
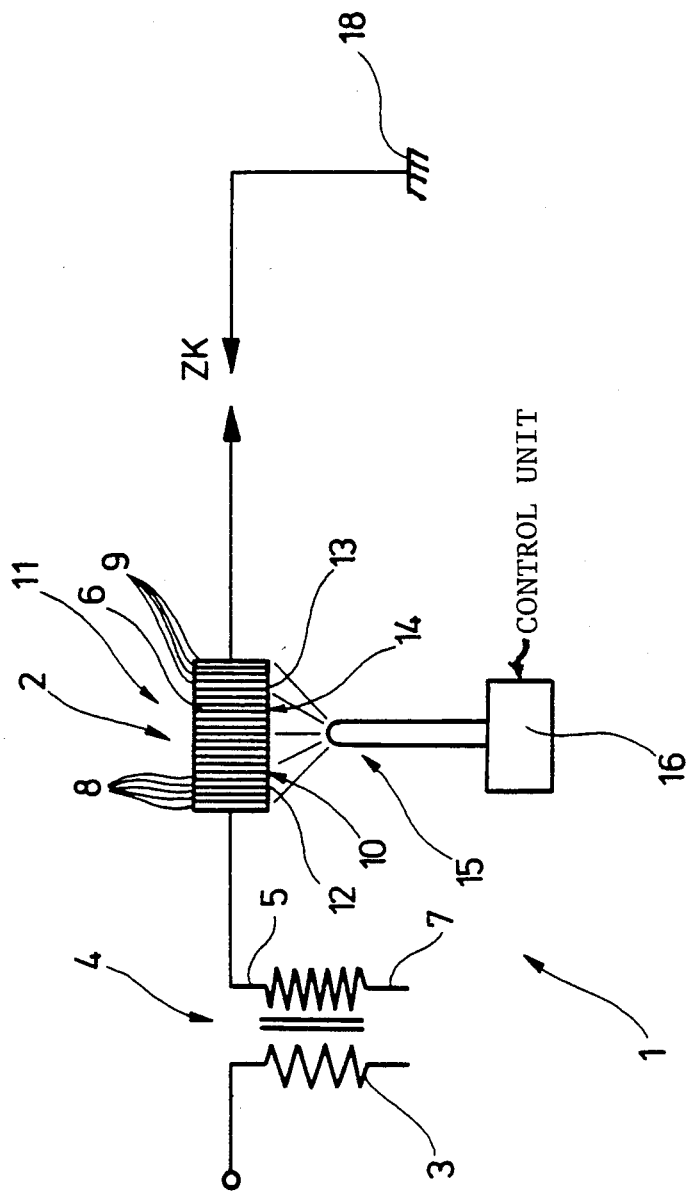

The invention will be described in connection with an ignition circuit for an automotive internal combustion engine (ICE). A high-voltage circuit 1 (FIG. 1) has a high-voltage switch 2 which operates as a high-voltage, high-energy distributor for ignition voltage to a spark plug ZK, shown only schematically, of an ICE, not shown. The primary winding 3 of a spark coil 4 is connected, as well known, and not further illustrated since it does not form part of the present invention; a terminal 5 of the secondary winding of the ignition coil 4 is connected to an input terminal of the high-voltage switch 2, formed as a cascaded circuit 6. The other terminal 7 of the secondary of the ignition coil can be connected to any circuit which is desired, not further illustrated, and, for example, to ground or chassis 18 of a vehicle. The ignition circuit, apart from the switch, does not form part of the present invention and hence can be constructed in accordance with any suitable and desired arrangement.

The cascade circuit 6 is formed by a plurality of serially connected opto-electrical semiconductor elements 8. The semiconductor elements 8 are photo thyristors which have major or phase surfaces which are stacked against each other. For example, the major surfaces may have p- or n- zones, and the stack can be so arranged that adjacent p- or n- zones are placed immediately against each other.

The semiconductor elements 8, formed as semiconductor chips 9, are so constructed that the circumferential or outer surfaces 12 of the outside 10 of the stack of chips 11 will form light sensitive or opto responsive control regions 13. These control regions 13 of all the chips 9 form a composite control surface 14 which can be controlled by a single, essentially point-formed light source 15 for control of the conduction state of the cascaded chip circuit 6. The light source 15 itself is controlled by a control unit 16 which, in turn, is controlled by the ICE, not shown, as well known, to provide control pulses.

The output terminal of the switch 2 is connected to an electrode of the spark plug ZK, the counter electrode of which is connected to ground or chassis 18.

Basic operation:

As soon as an ignition voltage pulse has sufficient energy at the secondary of the ignition coil 4, the control unit 16, at an instant computed in accordance with operating parameters of the ICE, will provide a control pulse to the light source 15, so that light is projected or applied to the control surface 14 of the stack 11 of the chips. This changes the conductive states of the chips from OFF to ON, and an ignition spark will jump over the gap of the spark plug ZK.

Figure 2:
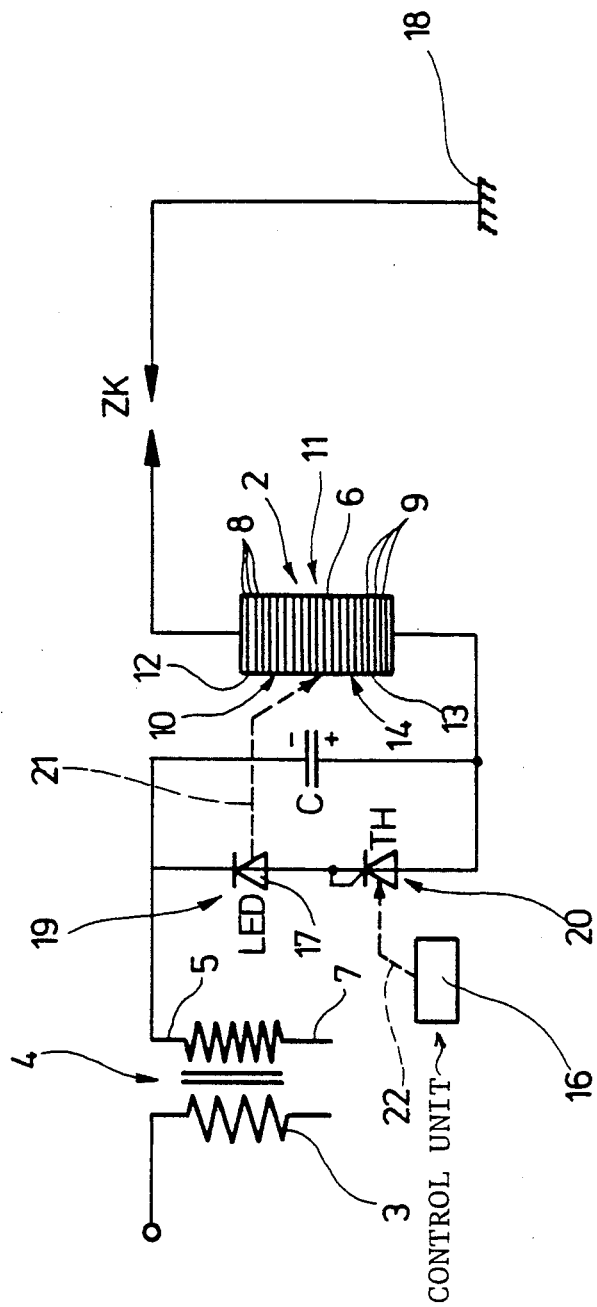

Embodiment of FIG. 2:

The light source 15 preferably is formed by a light emitting diode (LED), which can be optically coupled either directly, or by interposition of an optical fiber or optical fiber cable or other light conductor with the control surface 14 of the cascaded circuit 6. As illustrated in FIG. 2, and differing from FIG. 1, the terminal 5 of the secondary of the ignition coil 4 is not connected directly to the LED array but, rather, through a capacitor C before being connected to the input terminal of the LED array 2. A series circuit 19 formed by the LED 17 and an opto switch 20 is connected in parallel to the capacitor C. The opto switch 20 is formed by a photo thyristor TH. The semiconductor chips 9 of the stack 11 are also photo thyristors. The LED 17 is so positioned that the light which is emitted thereby impinges on or is projected on the control surface 14 of the high-voltage switch 2, as schematically illustrated in FIG. 2 by broken line 21, representing optical coupling. A further optical coupling 22 is provided between the control unit 16 and the photo thyristor TH, as shown by broken line 22. Thus, a light pulse generated by the control unit 16 is applied on the light sensitive surface of the photo thyristor TH, thus changing its conduction state from OFF to ON.

Operation, circuit of FIG. 2:

The capacitor C is charged, as indicated by the polarity markings in FIG. 2, by the ignition coil 4. When the secondary voltage at the ignition coil 4 of an ignition pulse has reached about half of its maximum value, a light pulse derived from the control unit 16 causes the photo thyristor TH to fire. The duration of the light pulse can be very short, for example in the order of about 5 microseconds. Upon firing of the photo thyristor TH, the capacitor 16 can discharge over the LED 17 which, then, will emit light which will be applied to the control surface 14 of the cascade circuit 6. This changes the conduction state of the semiconductor chips 9 of the high-voltage switch 2 to their conductive or ON condition, so that the entire high-voltage cascade switch will be conductive and the ignition pulse to form a spark will be applied to the spark plug ZK.

Various changes and modifications may be made, and any features described herein may be used with any of the others, within the scope of the inventive concept.

We claim:

1. High-voltage opto-electronic switching circuit, particularly for control of application of ignition energy to a spark plug (ZK) of an internal combustion (IC) engine, having a high-voltage switch (2) including a photo responsive array (6) formed by a plurality of optically responsive semiconductor elements (8) and electrically connected in a cascade circuit (66);

a control means (16);

and light emitting means (15) controlled by the control means for emitting light and optically coupled to said array (6) of the semiconductor elements (8);

wherein, in accordance with the invention, said semiconductor elements comprise a stack of disk or plate-shaped semiconductor chips (9) forming said cascade circuit and each having light sensitive or optically responsive control regions (13), wherein said chips are located with their major surfaces against each other;

said control regions (13) are located at an outer surface of said chips; and wherein said control regions (13) of the chips (9) of the cascaded circuit (6) are optically coupled to said light emitting means.

2. The circuit of claim 1, wherein said control regions (13) of the stacked chips (9) forming said array control form a control surface (14); and wherein the control regions (13) in said surface are dimensioned for optical coupling with an essentially point-formed light emitting means (15).

3. The circuit of claim 1, wherein said light emitting means (15) is a light emitting diode (17) (LED).

4. The circuit of claim 1, further including a light guide or optical fiber coupling from the light emitting means (15) toward the control regions (13) of the array of semiconductor chips (9).

5. The circuit of claim 2, wherein the light emitting means (15) comprises a light emitting diode (17) (LED); and a light guide or optical fiber coupling is provided from the light emitting diode (17) toward the optical control surface (14).

6. The circuit of claim 1, further including an opto-electronic switch (20) coupled to said control means (16) and controlling operation of said light emitting means (15).

7. The circuit of claim 3, further including an opto-electronic switch (20) coupled to said control means (16) and controlling operation of said light emitting diode (17).

8. The circuit of claim 1, wherein said semiconductor chips (9) are photo thyristors.

9. The circuit of claim 7, wherein said opto-electronic switch (20) comprises a photo thyristor (TH).

10. The circuit of claim 1, in combination with an ignition coil (4) having a secondary winding and comprising a capacitor (C) connected between said secondary winding and said high-voltage switch (2); and a series circuit connected in parallel to said capacitor (C), said series circuit comprising an opto-electronic switch (20) controlled by said control means (16) and a light emitting diode (17) (LED), said LED forming said light emitting means (15).

11. The circuit of claim 10, wherein said semiconductor chips (9) comprise photo thyristors; and wherein said opto electronic switch (20) comprises a photo thyristor (TH).

12. The circuit of claim 10, further including a light guide or optical fiber coupling from the light emitting means (15) toward the control regions (13) of the array of semiconductor chips (9).

* * * * *